(12) United States Patent
Iwanami

(10) Patent No.: US 8,625,040 B2
(45) Date of Patent: Jan. 7, 2014

(54) ARRAY SUBSTRATE FOR USE IN DISPLAYS, AND METHOD OF MANUFACTURING THE SAME

(75) Inventor: Norishige Iwanami, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 215 days.

(21) Appl. No.: 13/044,824

(22) Filed: Mar. 10, 2011

(65) Prior Publication Data

US 2011/0221992 A1 Sep. 15, 2011

(30) Foreign Application Priority Data

Mar. 12, 2010 (JP) ................... 2010-056325

(51) Int. Cl.
*G02F 1/136* (2006.01)

(52) U.S. Cl.
USPC .......................................................... 349/43

(58) Field of Classification Search
None
See application file for complete search history.

(56) References Cited

U.S. PATENT DOCUMENTS

| 6,414,730 | B1 | 7/2002 | Akamatsu et al. |
| 7,787,095 | B2 | 8/2010 | Lim |
| 2007/0002223 | A1 | 1/2007 | Park |
| 2009/0109365 | A1* | 4/2009 | Yoo et al. ................. 349/46 |

FOREIGN PATENT DOCUMENTS

| JP | 58-213449 A | 12/1983 |
| JP | 10-340953 A | 12/1998 |
| JP | 2000-199917 A | 7/2000 |
| JP | 2005-242372 A | 9/2005 |
| JP | 2006-209089 A | 8/2006 |
| JP | 2007-011269 A | 1/2007 |
| JP | 2008-066443 A | 3/2008 |
| JP | 2008-287259 A | 11/2008 |
| JP | 2011-077116 A | 4/2011 |

OTHER PUBLICATIONS

Japanese Office Action dated Jan. 17, 2012 (and English translation thereof) in counterpart Japanese Application No. 2010-056325.
Japanese Decision to Grant a Patent dated Oct. 30, 2012 issued in counterpart Japanese Application No. 2010-056325.

* cited by examiner

*Primary Examiner* — Thanh-Nhan P Nguyen
(74) *Attorney, Agent, or Firm* — Holtz, Holtz, Goodman & Chick, PC

(57) ABSTRACT

An array substrate for displays, includes a first conductive film pattern, a first insulating layer, a second conductive film pattern, a second insulating layer, a contact hole, and a transparent conductive film. The first conductive film pattern is pattern-formed on a transparent substrate. The first insulating layer is formed on the first conductive film pattern. The second conductive film pattern is pattern-formed upper the first insulating layer and overlapping the first conductive film pattern. The second insulating layer is formed upper the first insulating layer and the second conductive film pattern. The contact hole is made from the first insulating layer to the second insulating layer. The transparent conductive film electrically connects the first conductive film pattern and the second conductive film pattern in the contact hole. The contact hole is made in a region where an edge of the second conductive film pattern overlaps the first conductive film pattern.

11 Claims, 9 Drawing Sheets

ARRAY SUBSTRATE FOR USE IN DISPLAYS, AND METHOD OF MANUFACTURING THE SAME

CROSS-REFERENCE TO RELATED APPLICATIONS

This application is based upon and claims the benefit of priority from prior Japanese Patent Application No. 2010-056325, filed Mar. 12, 2010, the entire contents of which are incorporated herein by reference.

BACKGROUND OF THE INVENTION

1. Field of the Invention

The invention relates to an array substrate for use in such as a liquid crystal display, and a method of manufacturing the same.

2. Description of the Related Art

Any liquid crystal display of active matrix type comprises a pixel substrate, a countersubstrate, and a liquid crystal layer interposed between the pixel substrate and the countersubstrate. Of these components, the pixel substrate is a transparent substrate made of, for example, glass. On the transparent substrate, a plurality of gate electrode lines are formed, and a plurality of drain electrode lines are formed intersecting the gate electrode lines. Further, thin-film transistors (TFTs), each made of amorphous silicon or the like, are arranged near the intersections of the gate electrode lines and drain electrode lines. Each TFT is connected not only to a gate electrode line and a drain gate line, but also to a pixel electrode that is a transparent electrode made of, for example, indium-tin oxide (ITO). The countersubstrate is a transparent substrate made of, for example, glass. On the countersubstrate, a counterelectrode is made of transparent material such as ITO.

In recent years, various methods have been proposed, which are designed to manufacturer an array substrate of so-called "top ITO structure." In each of these methods, pixel electrodes are formed on the uppermost layer of the pixel substrate in order to reduce the number of steps of manufacturing the pixel substrate, as described in, for example, Jpn. Pat. Appln. KOKAI Publication No. 2005-242372. To ensure electrical connection of the lines running on the layers of the top ITO structure, the layers have contact holes. Through the contact holes, the lines extend through layers, whereby any line provided on one layer can be electrically connected to a line or lines provided on any other layer.

In such a method of manufacturing an array substrate, the gate electrode lines and drain electrode lines can be formed at the same time the TFTs for pixels are formed. This can serve to reduce the manufacturing steps.

It is desired that the contact holes should be gently tapered from an upper layer toward a lower layer. If each contact hole is so tapered, a line can extend through the contact hole, not cut at all. As a result, the line reliably connects two associate lines provided on the upper and lower layer, respectively.

A plurality of contact holes of different depths may be made in the same manufacturing step. In this case, a shallow contact hole is exposed to etchant for a longer time than a deep contact hole. The shallow contact hole will be over-etched. If over-etched, the contact hole may be tapered in the reverse direction, that is, from a lower layer to an upper layer. (This result will be called "reverse taper.")

The line formed in any contact hole of reverse taper may be cut at any part. If this happens, the associated two lines provided on the upper and lower layers, respectively, may not be connected.

BRIEF SUMMARY OF THE INVENTION

According to a first aspect of the invention, there is provided an array substrate for use in displays, comprising: a first conductive film pattern pattern-formed on a transparent substrate; a first insulating layer formed on the first conductive film pattern; a second conductive film pattern pattern-formed upper the first insulating layer, overlapping the first conductive film pattern; a second insulating layer formed upper the first insulating layer and the second conductive film pattern; a contact hole made from the first insulating layer to the second insulating layer; and a transparent conductive film electrically connecting the first conductive film pattern and the second conductive film pattern in the contact hole, wherein the contact hole is made in a region where an edge of the second conductive film pattern overlaps the first conductive film pattern.

According to a second aspect of the invention, there is provided a method of manufacturing an array substrate for use in displays, the method comprising: pattern-forming a first conductive film pattern on a transparent substrate; forming a first insulating layer on the first conductive film pattern; pattern-forming a second conductive film pattern upper the first insulating layer, overlapping the first conductive film pattern; forming a second insulating layer, overlapping the first insulating layer and the second conductive film pattern; making a contact hole extending through the first insulating layer and the second insulating layer, in a region where an edge of the second conductive film pattern overlaps the first conductive film pattern; and forming a transparent conductive film electrically connecting the first conductive film pattern and second conductive film pattern in the contact hole.

According to a third aspect of the invention, there is provided an array substrate for use in displays, comprising: a first conductive film pattern pattern-formed on a transparent substrate; a first insulating layer formed on the first conductive film pattern; a second conductive film pattern pattern-formed upper the first insulating layer, overlapping the first conductive film pattern; a second insulating layer formed upper the first insulating layer and the second conductive film pattern; and a transparent conductive film including a contact hole made from the second insulating layer to the first insulating layer, exposing the first conductive film pattern and a region of the second conductive film pattern, which overlaps the first conductive film pattern, a first conductive-film contact region contacting the first conductive film pattern in the contact hole, a second conductive-film contact region contacting the second conductive film pattern in the contact hole, a forming region provided on the second insulating layer, a first conductive region electrically connecting the first conductive-film contact region and the second conductive-film contact region, and a second conductive region electrically connecting the first conductive-film contact region and the forming region, without contacting the second conductive-film pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the invention will be explained with reference to the drawings.

Figure 1:
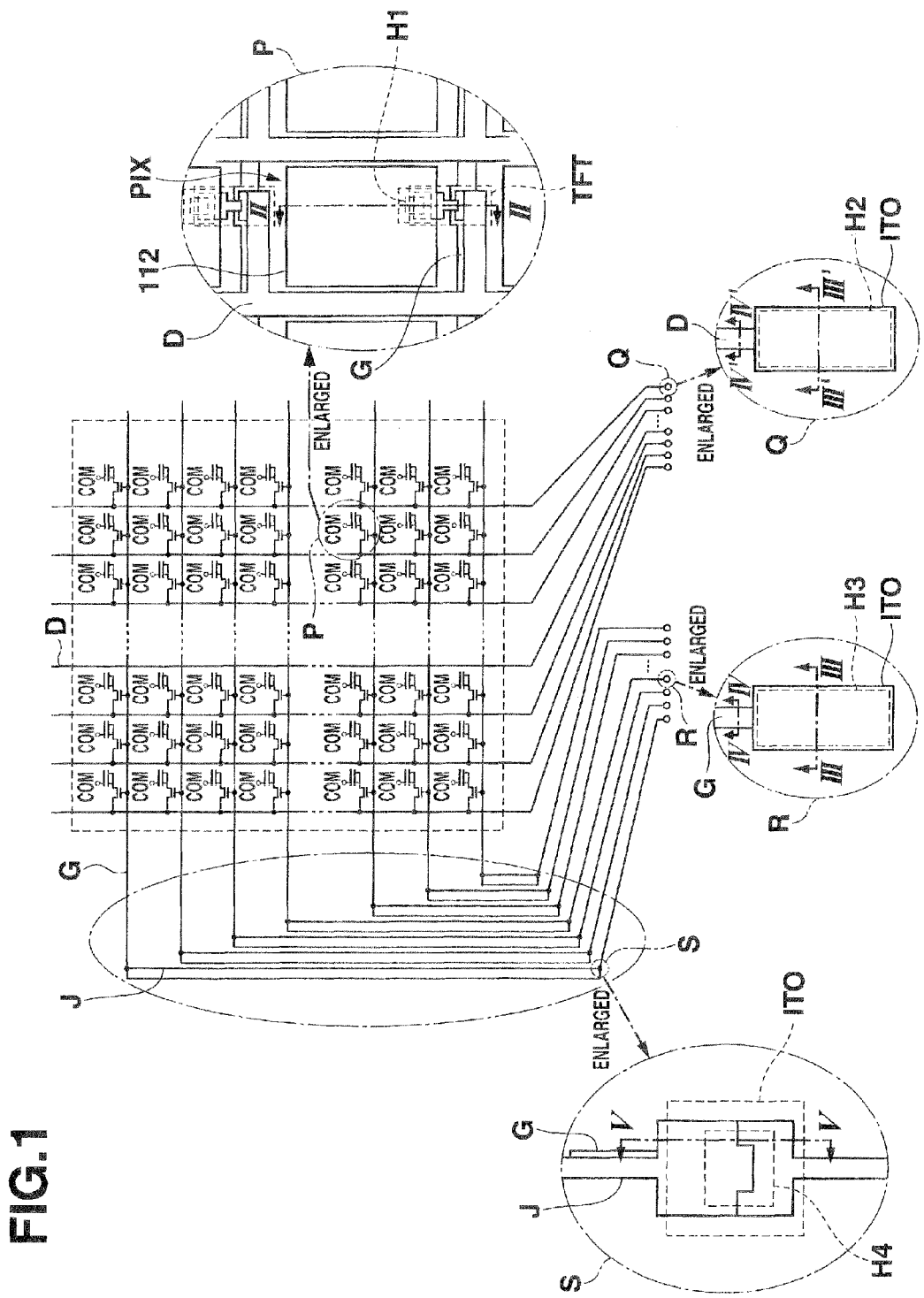
FIG. 1 is a diagram showing the configuration of a liquid crystal display panel including a display array substrate according to an embodiment of the invention.

FIG. 1 is a diagram showing a schematic configuration of a liquid crystal display panel that includes a display array substrate according to an embodiment of the invention.

The liquid crystal display panel shown in FIG. 1 comprises a pixel substrate, and a countersubstrate, and a liquid crystal layer interposed between the pixel substrate and countersubstrate.

On the pixel substrate, a plurality of gate electrode lines G and a plurality of drain electrode lines D are arranged, the former intersecting with the latter. Pixel electrodes 112 are arranged, respectively, at the positions corresponding to the intersections of the gate electrode lines G and drain electrode lines D.

Each pixel electrodes 112 is made of transparent conductive film of, for example, indium-tin oxide (ITO). As shown at region P of FIG. 1, the pixel electrodes 112 is connected to the source electrode S of a thin-film transistor TFT, which functions as a switching element.

The pixel substrate according to the embodiment has the top ITO structure. The top ITO structure has an ITO layer that is the uppermost layer of the multi-layer substrate. In the top ITO structure, each pixel electrode 112 and each source electrode S are connected in a contact hole H1 (first contact hole).

The countersubstrate is arranged opposing the pixel substrate. On the countersubstrate, a common electrode COM is formed.

The pixel substrate and the countersubstrate are adhered to each other a seal member (not shown). The seal member seals the space between the pixel substrate and countersubstrate, preventing the liquid crystal leaking from the space.

One display pixel PIX includes a pixel electrode 112, the common electrode COM, and that part of the liquid crystal layer, which lies between the pixel electrode 112 and the common electrode COM.

Each drain electrode line D is led from the display part of the liquid crystal display panel, on which the display pixels PIX are arranged in the form of a two-dimensional array, and is connected to a drain driver (not shown). As shown at region Q of FIG. 1, a terminal part that connects the drain electrode lines D to a gate driver has openings H2, through which the drain electrode lines D are exposed, respectively. Through the opening H2, ITO is formed as a protective film. The protective film protects the surface of each drain electrode line D.

Each gate electrode line G is led from the display part of the liquid crystal display panel, on which the display pixels PIX are arranged in the form of a two-dimensional array, and is connected to the gate driver (not shown). As shown at region R of FIG. 1, a terminal part that connects the gate electrode lines G to the gate driver has openings H3, through which the gate electrode lines G are exposed, respectively. Through the opening H3, ITO is formed as a protective film. This protective film protects the surface of each gate electrode line G.

Further, jumper lines J are connected to the gate electrode lines G, respectively, so that the jumper lines J are extending parallel to the gate electrode lines G. Because of the use of jumper lines, the interconnect resistance can be lower than in the case where only the gate electrode lines G are used. As will be described later in detail, the jumper lines J are formed in the same step in the embodiment, as the drain electrodes (drain electrode lines) D and source electrodes S of TFTs. Hence, as shown at region S of FIG. 1, the gate electrode lines G are connected to the respective jumper lines J, in contact holes H4 (second contact holes).

Figure 2:
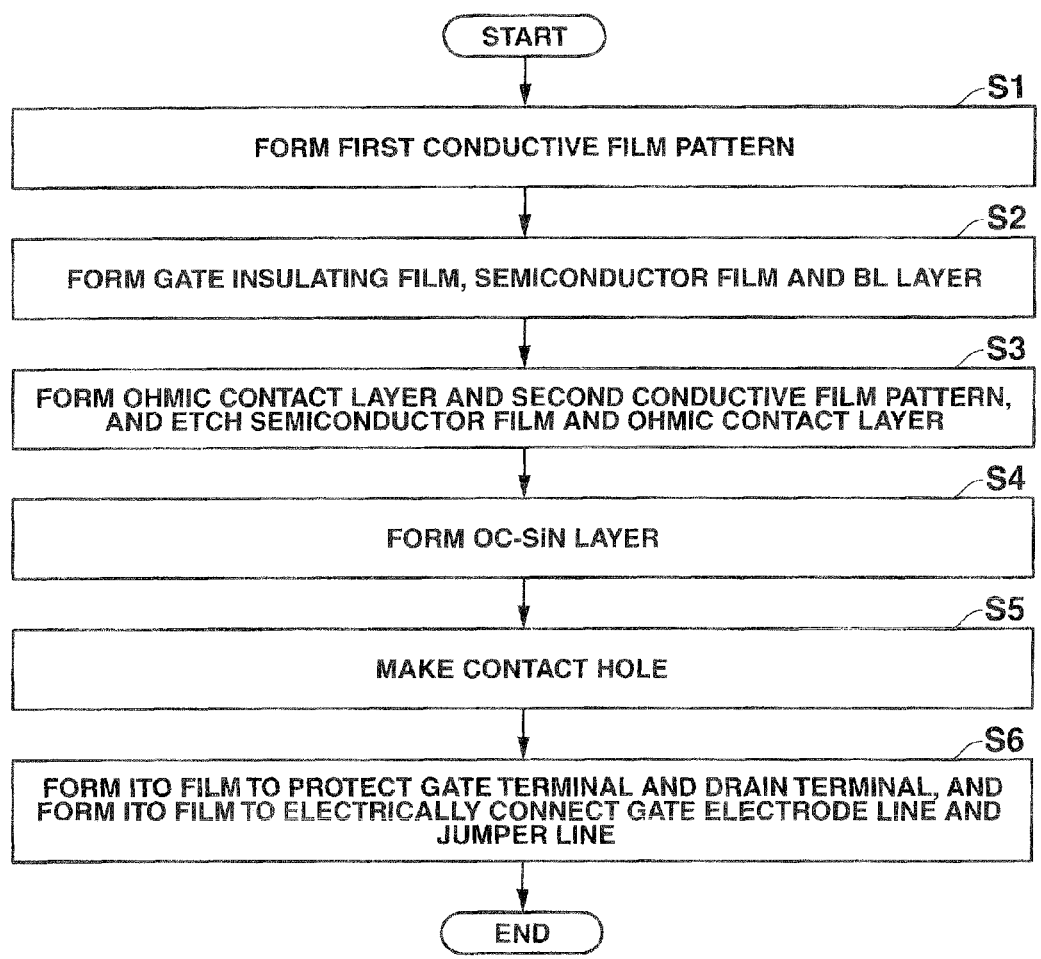
FIG. 2 is a flowchart showing a method of manufacturing a pixel substrate for use as the display array substrate according to the embodiment of the invention.

A method of manufacturing a pixel substrate for use in a display array substrate according to the embodiment of the invention will be described. FIGS. 3A to 3F, FIGS. 4A to 4F, FIGS. 5A to 5E and FIGS. 6A to 6F are diagrams showing a method of manufacturing a pixel substrate to be used as the display array substrate according to the embodiment. FIG. 2 is a flowchart showing the method of manufacturing the pixel substrate for use as the display array substrate according to the embodiment of the invention. The method includes six steps, which will be described later. FIG. 3A to FIG. 3F are magnified sectional views, taken along line II-II shown in FIG. 1, showing the steps of forming a TFT part. FIG. 4A to FIG. 4F are magnified sectional views, taken along lines III-III and line III'-III' shown in FIG. 1, showing the steps of forming a terminal part. FIG. 5A to FIG. 5E are magnified sectional views, taken along lines IV-IV and IV'-IV' shown in FIG. 1, showing the steps of forming an interconnect part. FIG. 6A to FIG. 6F are magnified sectional views, taken along lines V-V shown in FIG. 1, showing the steps of forming the jumper line part of the interconnect part. The TFTs manufactured in the method according to the embodiment are TFTs of inverse stagger structure. In the inverse stagger structure, the gate electrode is formed at a lower layer, and the drain and source electrodes are formed at an upper layer.

First, in the first step (Step S1), spattering is performed, forming a thin metal film (first conductive film) of Mo (molybdenum) or alloy thereof, on a transparent substrate (glass substrate) 100. Then, photoresist is applied to the thin metal film formed on the glass substrate 100, forming various electrode patterns by means of photolithography. Dry etching, for example, is then performed, removing those parts of the thin metal film, which are not coated with the photoresist, and maintaining those parts of the thin metal film, which are coated with the photoresist. As a result, a prescribed first conductive film pattern is formed.

Figure 3A:
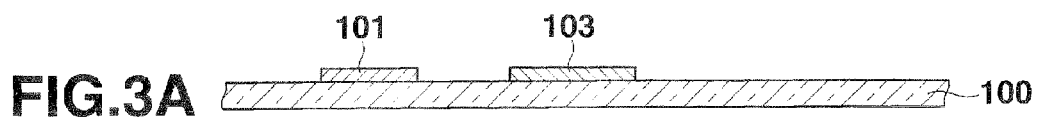
FIG. 3A is a diagram showing a step of forming a first conductive film pattern or a step of forming the TFT part of a pixel substrate for use as a display array substrate according to the embodiment of the invention.
Figure 3B:
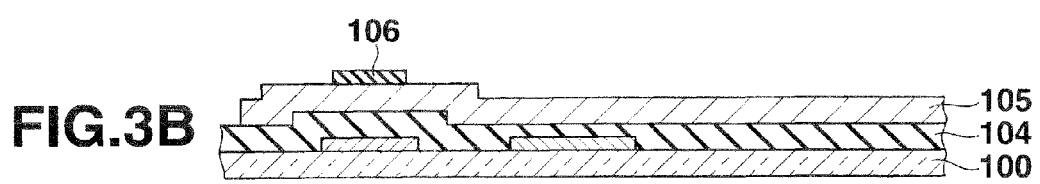
FIG. 3B is a diagram showing a step of forming a gate insulating layer, a semiconductor film and a BL layer, or another step of forming the TFT part of the pixel substrate for use as the display array substrate according to the embodiment of the invention.
Figure 4A:
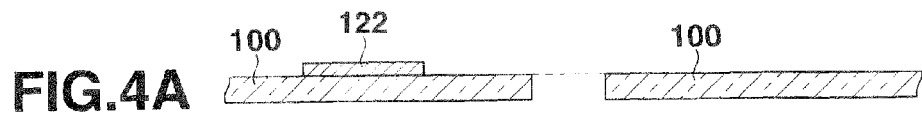
FIG. 4A is a diagram showing a step of forming a first conductive film pattern, or a step of forming the terminal part of the pixel substrate for use as the display array substrate according to the embodiment of the invention.
Figure 4B:
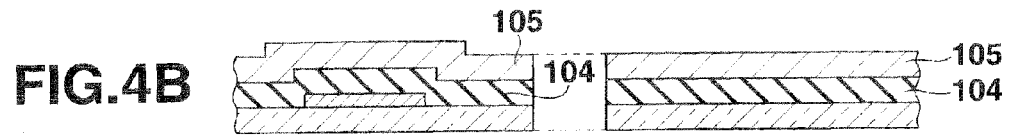
FIG. 4B is a diagram showing a step of forming a gate insulating layer and a semiconductor film, or another step of forming the terminal part of the pixel substrate for use as the display array substrate according to the embodiment of the invention.
Figure 4C:
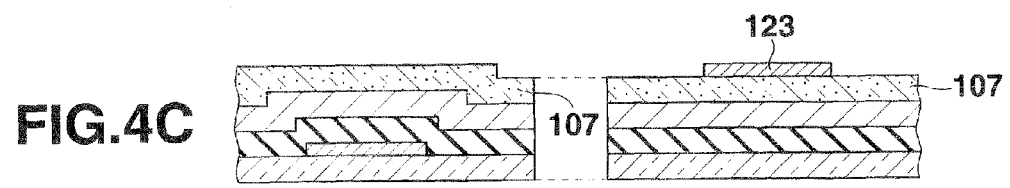
FIG. 4C is a diagram showing a step of forming an ohmic contact layer and a second conductive film pattern, or still another step of forming the terminal part of the pixel substrate used in the display array substrate according to the embodiment of the invention.
Figure 5A:
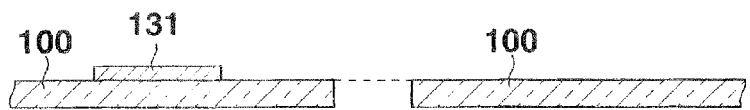
FIG. 5A is a diagram showing a step of forming a first conductive film pattern, or a step of forming the interconnect part of the pixel substrate for use as the display array substrate according to the embodiment of the invention.
Figure 5B:
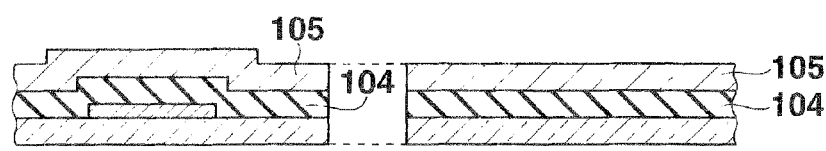
FIG. 5B is a diagram showing a step of forming an gate insulating layer and a semiconductor film, or another step of forming the interconnect part of the pixel substrate used in the display array substrate according to the embodiment of the invention.
Figure 5C:
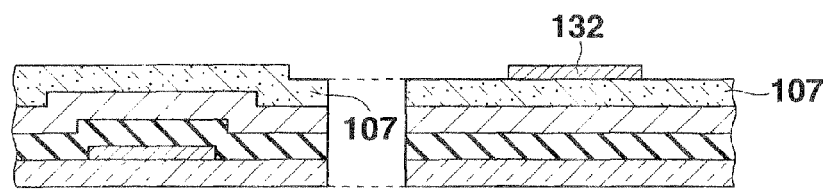
FIG. 5C is a diagram showing a step of forming an ohmic contact layer and a second conductive film pattern, or a still another step of forming the interconnect part of the pixel substrate for use as the display array substrate according to the embodiment of the invention.
Figure 6A:
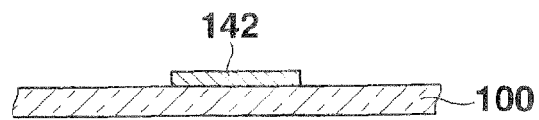
FIG. 6A is a diagram showing a step of forming a first conductive film pattern, or a step of forming the jumper line part of the interconnect part of the pixel substrate for use as the display array substrate according to the embodiment of the invention.
Figure 6B:
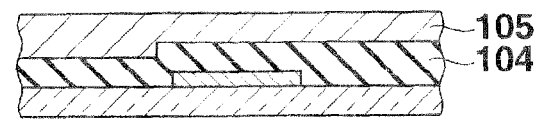
FIG. 6B is a diagram showing a step of forming a gate insulating layer and a semiconductor film, or another step of forming the jumper line part of the interconnect part of the pixel substrate for use as the display array substrate according to the embodiment of the invention.

The first conductive film pattern, thus formed in the first step, includes a gate electrode 101 shown in FIG. 3A, a film 103 for stopping etching, shown in FIG. 4A, a gate terminal 122 shown in FIG. 5A, and gate electrodes 131 and 142 shown in FIG. 6A. In FIG. 3A, FIG. 4A, FIG. 5A and FIG. 6A, the gate electrode line 101, gate electrode line 131 and gate terminal 122 appear isolated from one another. In fact, they are elements of the same pattern, and are continuous to one another as shown in FIG. 1. By contrast, the film 103 for stopping etching is pattern-formed, insulated from the gate electrode 101, from the gate electrode lines 131 and 142, and from the gate terminal 122. The film 103 for stopping etching is used as a protective film that will protect the glass substrate 100 in the step of making a contact hole H1 used in order to form the pixel electrode 112 as will be described later.

Next, in the second step (Step S2), a G-SiN layer (gate-insulating nitride silicon film, or first insulating layer) 104, an i-Si film (neutral amorphous silicon film, or semiconductor film) 105, and a BL-SiN layer (silicon nitride film of protecting the channel) are formed, one after another.

Thereafter, photoresist is applied to the BL-SiN layer. Then, photolithography is performed on the BL-SiN layer, forming a prescribed pattern. At this point, the G-SiN layer is kept intact in its entirety.

Thus, in the second step, a gate insulating layer 104, a semiconductor film 105, and a BL layer (channel protective layer) 106 are formed as shown in FIG. 3B, FIG. 4B, FIG. 5B and FIG. 6B. The semiconductor film 105 serves as channels of TFTs. The BL layer 106 is a protective layer that protects the semiconductor film 105 while an ohmic contact layer 107 (later described) is being etched.

Next, in the third step (Step S3), aqueous solution of ammonium fluoride ($NH_4F$) is applied, removing the natural oxide film formed on the semiconductor film 105 exposed after the second step. Then, plasma CVD method, for example, is performed, forming an n+Si (N-type amorphous silicon film, or ohmic contact layer) 107. The ohmic contact layer 107 is provided in order to enhance the ohmic contact between the semiconductor film 105, on the one hand, and the source and drain electrodes, on the other. After the ohmic contact layer 107 has been formed, spattering is performed, a thin metal film (second conductive film) of Mo or alloy thereof, on the ohmic contact layer 107.

As described above, the source electrode S, drain electrode (drain electrode line) D, etc., are processed at the same time. Therefore, the second conductive film pattern is formed by, for example, dry etching, removing those parts of the thin metal film, which are not coated with photoresist, and maintaining those parts of the thin metal film, which are coated with the photoresist. As a result, a prescribed second conductive film pattern is formed. Thus, in the third step, the drain electrode 108 and source electrode 109 of a TFT, drain terminal 123, drain electrode line 132 and jumper line 143 are formed, as second conductive film pattern, as shown in FIG. 3C, FIG. 4C, FIG. 5C and FIG. 6C.

Figure 3C:
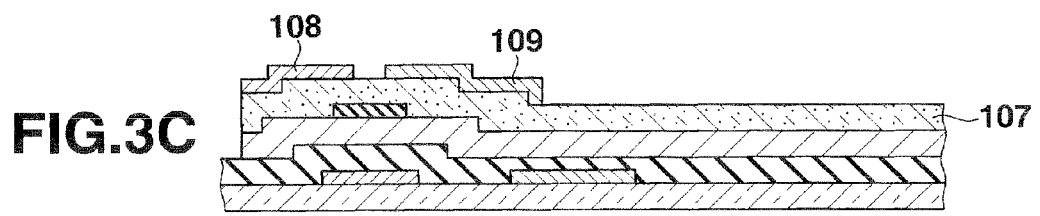
FIG. 3C is a diagram showing a step of forming an ohmic contact layer and a second conductive film pattern, or further step of forming the TFT part of the pixel substrate for use as the display array substrate according to the embodiment of the invention.
Figure 3D:
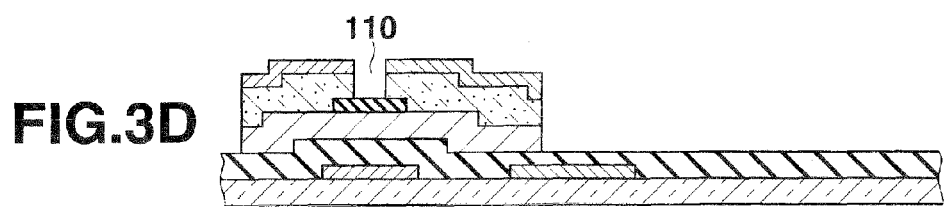
FIG. 3D is a diagram showing a step of etching the semiconductor film and the ohmic contact layer, or another step of forming the TFT part of the pixel substrate for use as the display array substrate according to the embodiment of the invention.
Figure 3E:
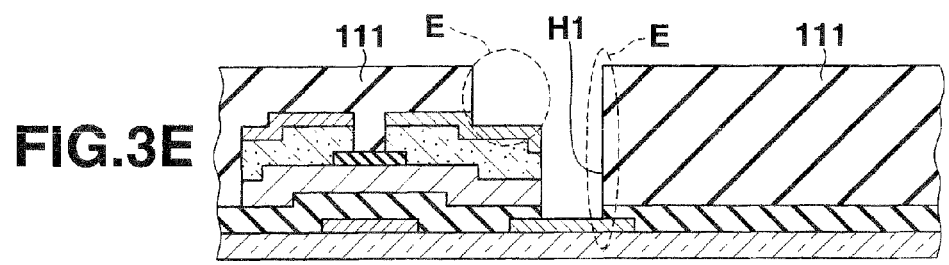
FIG. 3E is a diagram showing a step of forming an OC-SiN layer and a contact hole, or a further step of forming the TFT part of the pixel substrate for use as the display array substrate according to the embodiment of the invention.
Figure 6C:
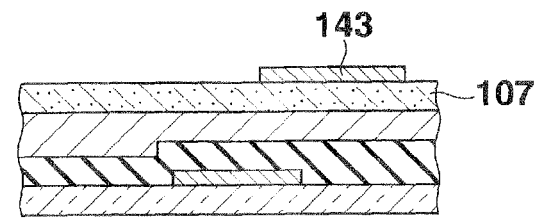
FIG. 6C is a diagram showing a step of forming an ohmic contact layer and a second conductive film pattern, or still another step of forming the jumper line part of the interconnect part of the substrate for use as the display array substrate according to the embodiment of the invention.

In the embodiment, as shown in FIG. 3C, the source electrode 109 is pattern-formed, with one part overlapping the film 103 for stopping etching, so that the drain electrode 108 may be electrically connected to the pixel electrode 112 to be formed in a process, which will be explained later. Moreover, as shown in FIG. 6C, the jumper line 143 is pattern-formed, with one part overlapping the gate electrode line 142, so that the gate electrode line 142 may be electrically connected to the jumper line 143.

Figure 4D:
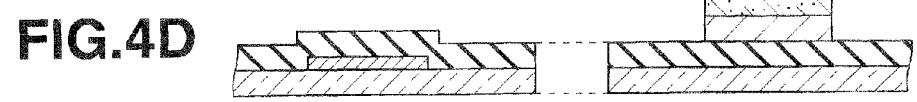
FIG. 4D is a diagram showing a step of etching the semiconductor film and the ohmic contact layer, or a further step of forming the terminal part of the pixel substrate for use as the display array substrate according to the embodiment of the invention.
Figure 4E:
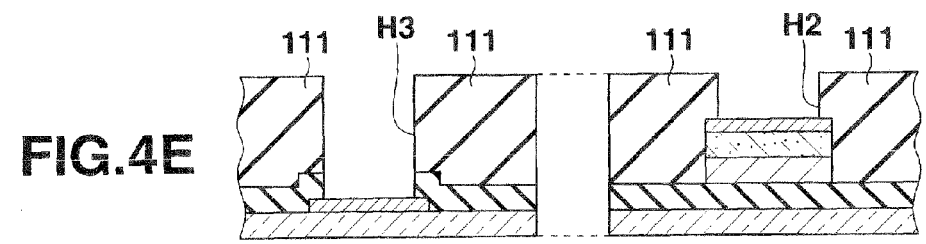
FIG. 4E is a diagram showing a step of forming an OC-SiN layer and making a contact hole, or a further step of forming the terminal part of the pixel substrate for use as the display array substrate according to the embodiment of the invention.
Figure 4F:
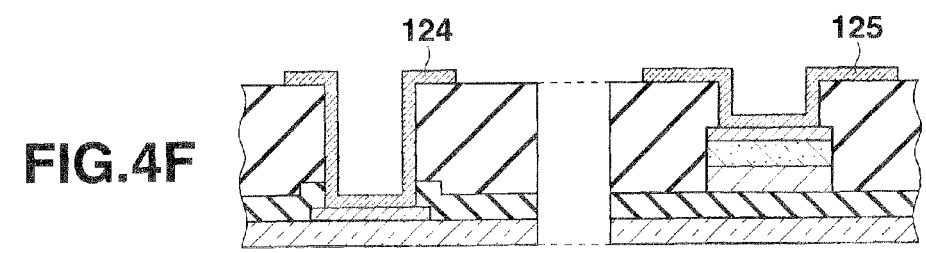
FIG. 4F is a diagram showing a step of forming an ITO film to protect a gate terminals and a drain terminal, or still another step of forming the terminal part of the pixel substrate for use as the display array substrate according to the embodiment of the invention.
Figure 5D:
FIG. 5D is a diagram showing a step of etching the semiconductor film and the ohmic contact layer, or a further step of forming the interconnect part of the pixel substrate for use as the display array substrate according to the embodiment of the invention.
Figure 6D:
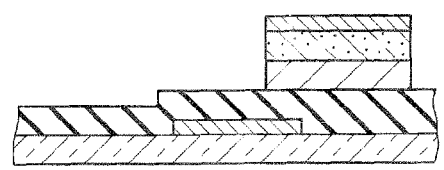
FIG. 6D is a diagram showing a step of etching the semiconductor film and ohmic contact layer, or a further step of forming the jumper line part of the interconnect part of the pixel substrate for use as the display array substrate according to the embodiment of the invention.

The drain electrode 108 and source electrode 109 of the TFT, drain terminal 123, drain electrode line 132 and jumper line 143, so formed, are then used as mask, and etching is performed on the ohmic contact layer 107 and the semiconductor film 105, to accomplish patterning. At this point, in the TFT part, only the ohmic contact 107 is etched as indicated by 110 in FIG. 3D, whereas the semiconductor film 105 is not etched, protected by the BL layer 106. In any part other than the TFT part, those parts of the semiconductor film 105 and ohmic contact layer 107, which are not masked with electrodes, are removed as shown in FIG. 4D, FIG. 5D and FIG. 6D.

Next, in the fourth step (Step S4), an OC-SiN layer (overcoat silicon nitride film, or second insulating layer) 111 is formed by, for example, plasma CVD method, on each electrode formed in the third step and on the gate insulating layer 104, in order to protect the entire pixel substrate including the semiconductor film 105.

Thereafter, in the fifth step (Step S5), photoresist is applied to the OC-SiN layer 111, and contact holes H1, H2, H3 and H4 are made by means of photolithography. In the embodiment, contact holes H1, H2, H3 and H4 are made, each extending from the OC-SiN layer 111 to the gate insulating layer 104. Therefore, the expose the source electrode 109, thin film 103 for stopping etching, gate terminal 122, drain terminal 123, gate electrode line 142 and jumper line 143, respectively, as shown in FIG. 3E, FIG. 4E, FIG. 5E and FIG. 6E. Contact holes H1 and H4 are made in the region where the edges of the second conductive film pattern overlap the first conductive film pattern.

Finally, in the sixth step (Step S6), spattering is performed, forming an ITO film in contact holes H1, H2, H3 and H4 made in the fifth step. In this embodiment, no ITO film is formed on the interconnect part. The ITO film already formed is first coated with photoresist and then subjected to photolithography. As a result, the ITO film acquires a prescribed pattern. At this time, ITO electrically connects the first conductive film pattern and the second conductive film pattern in contact holes H1 and H2.

Figure 3F:
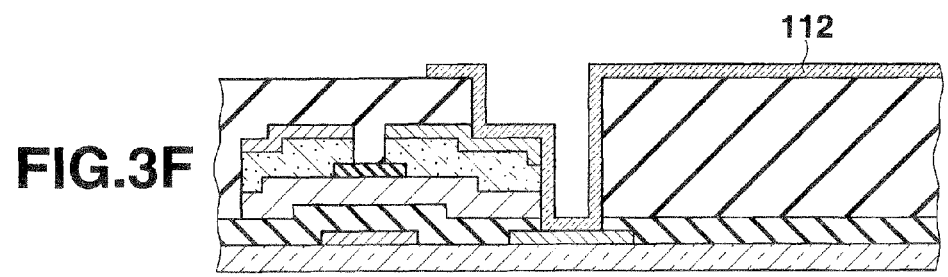
FIG. 3F is a diagram showing a step of forming a pixel electrode, or a still another step of forming the TFT part of the pixel substrate for use as the display array substrate according to the embodiment of the invention.
Figure 6E:
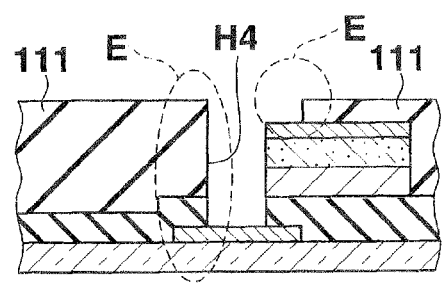
FIG. 6E is a diagram showing a step of forming an OC-SiN layer and making a contact hole, or another step of forming the jumper line part of the interconnect part of the pixel substrate for use as the display array substrate according to the embodiment of the invention.
Figure 6F:
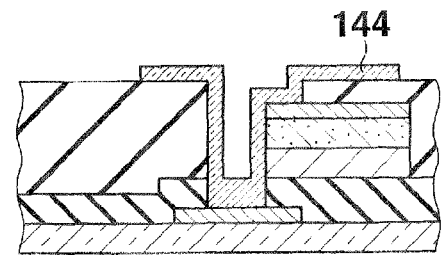
FIG. 6F is a diagram showing a step of forming an ITO film to connect a gate electrode line and a jumper line, or a further step of forming the jumper line part of the interconnect part of the pixel substrate for use as the display array substrate according to the embodiment of the invention.

As shown in FIGS. 3F and 6F, the ITO film has a first conductive-film contact region, a second conductive-film contact region, a first conductive region, and a second conductive region. The first conductive-film contact region contacts the first conductive film pattern in contact hole H1 and contact holes H4. The second conductive-film contact region contacts the second conductive film pattern in contact hole H1 and contact holes H4. The first conductive region electrically connects the forming region of the second insulating layer, first conductive-film contact region and second conductive-film contact region, to one another. The second conductive region is a region extending from the first conductive-film contact region to the forming region, electrically connecting the first conductive-film contact region and the forming region to each other. Nonetheless, the second conductive region does not contact the second conductive film pattern, which does not exist between the first conductive-film contact region and the forming region.

In the sixth step, as shown in FIG. 3S, FIG. 4F, FIG. 5E and FIG. 6E, the pixel electrode 112, an ITO film 124 protecting the gate terminal 122, and an ITO film 125 protecting the drain terminal 123, and an ITO film 144 electrically connecting the gate electrode line 142 and the jumper line 143, are formed.

The pixel electrode 112 has been formed by processing the ITO film, in such a way that it is connected to the drain electrode or the source electrode by the thin-film contact region of the ITO film and the forming region of the second insulating layer. As the six steps described above are performed, a pixel substrate according to the embodiment is manufactured.

The method of manufacturing a display array substrate, according to the embodiment, will be compared a comparative method, in order to demonstrate the advantage of the method according to the embodiment. First, the comparative method will be described with reference to FIG. 7A and FIG. 7B. The components identical to those of the embodiment will not be described.

Figure 7A:
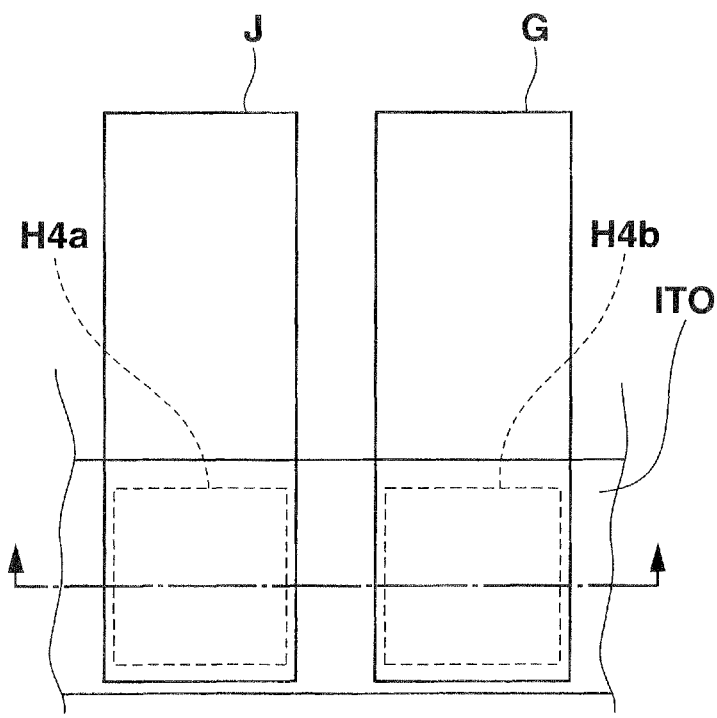
FIG. 7A is a plan view showing the configuration of a jumper line part manufactured by a comparative method.
Figure 7B:
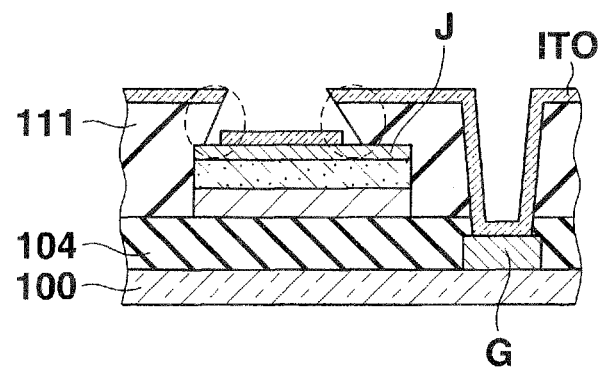
FIG. 7B is a sectional view showing the configuration of the jumper line part manufactured by the comparative method.

FIG. 7A and FIG. 7B are a plan view and a sectional view, respectively, which show, in detail, part E of FIG. 6E, which pertains to a jumper line part manufactured by the comparative method. Part E of FIG. 6E is the surface of contact hole H4, more precisely that surface part of contact hole H4, which lies in the OC-SiN layer 111 provided on the jumper line 143 and that surface part of contact hole H4, which lies in the gate insulating layer 104 and OC-SiN layer 111, both provided on the gate electrode line 142.

In the comparative method, a gate electrode line G (first conductive film pattern) is pattern-formed on a transparent substrate. Further, a jumper line J (second conductive film pattern) is pattern-formed above the gate electrode line G, not overlapping the gate electrode line G. A contact hole Ha and a contact hole Hb are made in the jumper line J and the gate electrode line G, respectively, and the jumper line J and the gate electrode line G are electrically connected by ITO.

Figure 5E:
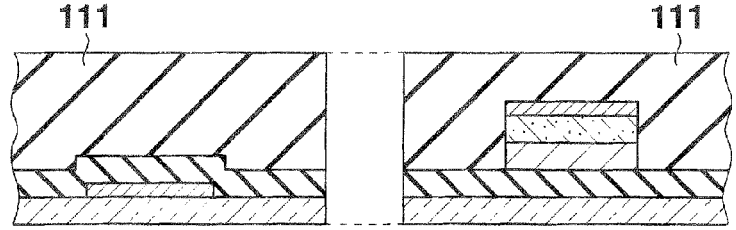
FIG. 5E is a diagram showing a step of forming an OC-SiN layer, or still another step of forming the interconnect part of the pixel substrate for use as the display array substrate according to the embodiment of the invention.

As shown in FIG. 5E and FIG. 6F, the gate electrode line G and the jumper line J are formed as different layers included in the pixel substrate. A contact hole H4a and a contact hole H4b for exposing the jumper line J and the gate electrode line G, respectively, need to have different depths.

If the etching for making contact hole H4a and the etching for making contact hole H4b are started at the same time, the etching lasts longer to make contact hole H4a than to make contact hole H4b. Over-etching occurs in making contact hole H4b. Consequently, contact hole H4a may be reversely tapered as shown in FIG. 7B.

This is because any electrode changes in upper surface condition when it is etched or a thin film is formed on it. As the upper surface condition changes after etching or after a thin film has been formed on the electrode, the side etching near the interface with the electrode may proceed at an increasing rate. If the thin film formed on the electrode is etched, exposing the electrode, and if the film remains exposed to the etchant thereafter for a long time, the side etching proceeds at higher rate at a position near the interface between the jumper line J and the OC-SiN layer provided on the jumper line J, than at the upper surface of the OS-SiN layer provided on the jumper line J. As a result, contact hole H4a is reversely tapered. If this happens, an ITO layer formed in contact hole H4a is, in all probability, discontinuous as shown in FIG. 7B. That is, the comparative method can hardly connect the gate electrode line G and the jumper line J, as is desired.

Figure 8A:
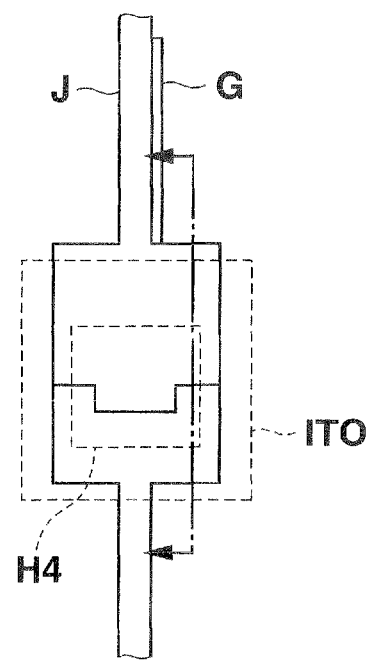
FIG. 8A is a plan view showing the configuration of a jumper line part manufactured by a method according to the embodiment of the invention.
Figure 8B:
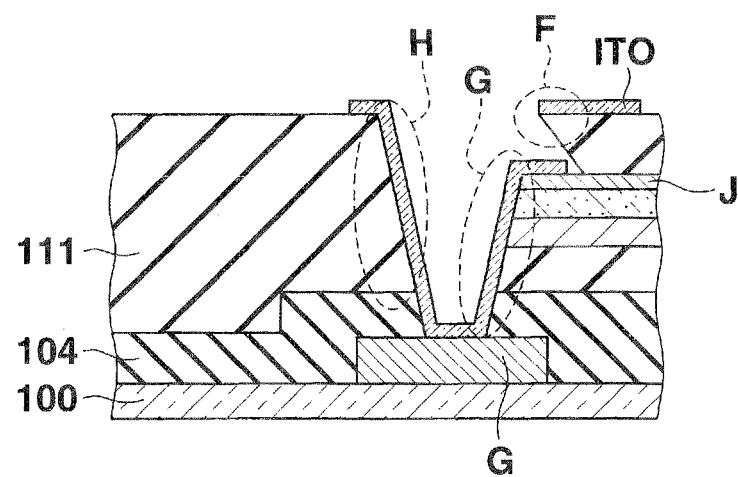
FIG. 8B is a sectional view showing the configuration of a jumper line part manufactured by the method according to the embodiment of the invention.

FIGS. 8A and 8B are a plan view and a sectional view, respectively, which schematically show a jumper line part formed by the method according to the embodiment. As shown in FIG. 8A, contact hole H4 is made in a region where an edge of the jumper line overlaps the gate electrode G and extends from the first insulating layer 104 to the second insulating layer 111. That is, the jumper line J and the gate electrode line G partly overlap each other, and one contact hole H4 is made in the overlapping parts. Therefore, that part of the jumper line J, which overlaps the gate electrode line G, is exposed in contact hole H4. In contact hole H4, ITO electrically connects the gate electrode line G and the jumper line J to each other. In this case, that part (i.e., part F shown in FIG. 8B) of the OC-SiN layer provided on the jumper line J may indeed etched away because contact hole H4 is reversely tapered in part. Nonetheless, that part of contact H4, which is below the jumper line J, is tapered, not inversely at all. This is because the gate electrode line G serves as mask for stopping etching.

ITO in contact hole H4 so made as described above has, in contact hole H4, a first conductive-film contact region (gate-electrode line contact region), a second conductive-film contact region, a forming region, a first conductive region, and a second conductive region. The first conductive-film contact region (gate-electrode line contact region) contacts the gate electrode line G in contact hole H4. The second conductive-film contact region (jumper-line contact region) contacts the jumper line J in contact hole H4. The forming region is formed on the OC-SiN layer. The first conductive region (part G shown in FIG. 8B) electrically connects the first conductive-film contact region and second conductive-film contact region. The second conductive region (part H shown in FIG. 8B) extends from the first conductive-film contact region to the forming region, electrically connecting the first conductive-film contact region to the forming region, but not contacting the jumper line J, or not existing the second conductive-film contact region between the first conductive-film contact region and the forming region. Hence, the gate electrode line C and the jumper line J can reliably be connected, even if part F shown in FIG. 8B, for example, is reversely tapered and the ITO is cut at this part F.

Figure 9A:
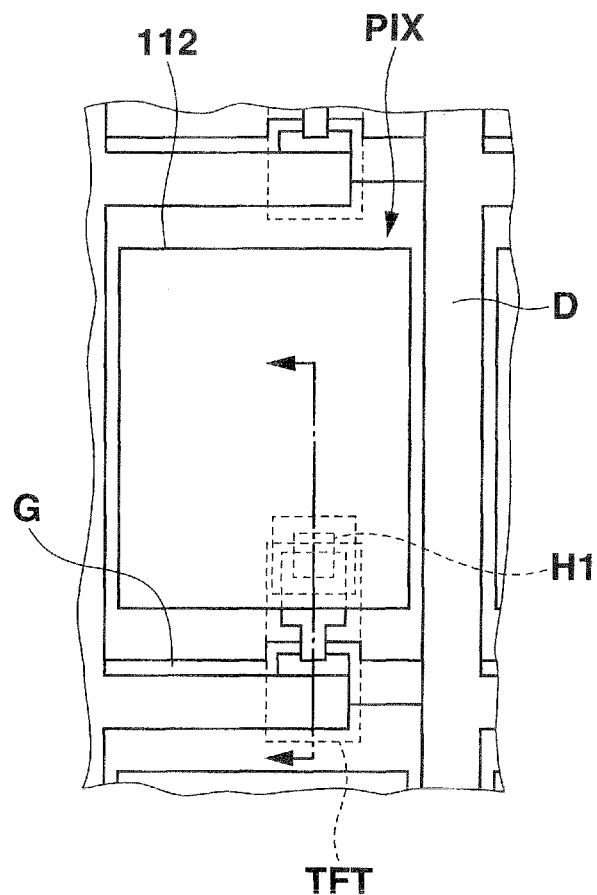
FIG. 9A is a plan view showing the configuration of a TFT part manufactured by a method according to the embodiment of this invention.
Figure 9B:
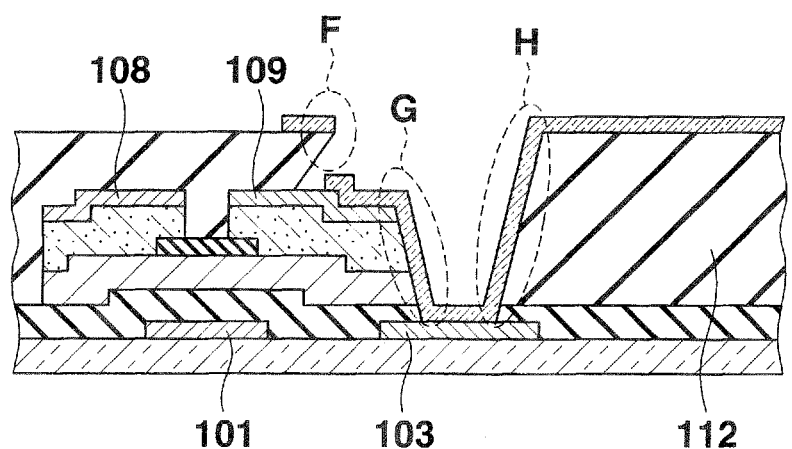
FIG. 9B is a sectional view showing the configuration of the TFT part manufactured by the method according to the embodiment of this invention.

FIGS. 9A and 9B are a plan view and a sectional view, respectively, which schematically show a TFT part formed by the method according to the embodiment. In this embodiment, that part (part F shown in FIG. 9B) of the OC-SiN layer, which lies above the source electrode 109, may be reversely tapered as shown in FIG. 9B, for the same reason as pointed out above. Nonetheless, that part of the OC-SiN layer, which lies below the source electrode 109, is tapered as desired.

If ITO is formed in contact hole H1 made as described above, it will have, in contact hole H1, a first conductive-film contact region, a second conductive-film contact region, a forming region, a first conductive region, and a second conductive region. The first conductive-film contact region (thin-film contact region) contacts the thin film 103 for stopping etching. The second conductive-film contact region (electrode line contact region) contacts the source electrode 109. The forming region is provided on the OC-SiN layer. The first conductive region (part G shown in FIG. 9B) electrically connects the first conductive-film contact region and the second conductive-film contact region. The second conductive region (part H shown in FIG. 9B) electrically connects the thin-film contact region and the forming region, and extends from the first conductive-film contact region to the forming region, not contacting the source electrode 109, or not existing the second conductive-film contact region between the first conductive-film contact region and the forming region.

Hence, even if part F shown in FIG. 9B is reversely tapered and the ITO element is therefore cut, thin film 103 for stopping etching and the source electrode 109 are reliably connected. In addition, since the thin film 103 is reliably connected to the pixel electrode, it can ensure the electrical connection of the source electrode and the pixel electrode.

As the plan view of FIG. 8A shows, the end J1 of the jumper line J is shaped convexity and extending in the direction the jumper line J extends. The end J1 is so shaped, increasing the area of the ITO element in order to ensure the electrical connection of the jumper line J and the gate electrode G. The shape of the end J1 of the jumper line J is not limited to a convex shape, nevertheless. The end J1 of the jumper line J may have any other shape.

In the embodiment, any elements that should be electrically connected can be reliably connected to one another as described above, even if a display array substrate including TFTs of inverse stagger structure has contact holes of different depths.

In the embodiment described above, the jumper line J is connected to the gate electrode line G in order to lower the interconnect resistance of the gate electrode line G. Instead, the jumper line J may be connected to the drain electrode line D. In this case, the jumper line J lies on the same layer as does the gate electrode G, and a part of the drain electrode line D overlaps a part of the jumper line J that lies below the layer.

In the embodiment described above, the configuration of the invention is applied to both the TFT part and the jumper line part. Nonetheless, the configuration may be applied to only the TFT part or the jumper line part.

Moreover, in the embodiment, the ITO film contacts the source electrode, at its electrode line contact region. Instead, it may contact the drain electrode, at its electrode line contact region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An array substrate for use in a display, comprising:
a first conductive film pattern pattern-formed on a transparent substrate;
a first insulating layer formed on the first conductive film pattern;
a second conductive film pattern pattern-formed above the first insulating layer, overlapping the first conductive film pattern;
a second insulating layer formed above the first insulating layer and the second conductive film pattern;
at least one contact hole extending from the first insulating layer to the second insulating layer; and
a transparent conductive film electrically connecting the first conductive film pattern and the second conductive film pattern in the at least one contact hole;
wherein the at least one contact hole is formed in a region where an edge of the second conductive film pattern overlaps the first conductive film pattern;
wherein:
the array substrate is a transistor array substrate including an inverse stagger-type transistor;
the first conductive film pattern includes a gate electrode of the inverse stagger-type transistor and a film for stopping etching;
the second conductive film pattern includes a source electrode or drain electrode of the inverse stagger-type transistor, and the source electrode or the drain electrode is formed overlapping the film for stopping etching; and
the at least one contact hole includes a first contact hole made in a region where an edge of the source electrode or the drain electrode overlaps the film for stopping etching; and
wherein the array substrate further comprises:
a semiconductor film formed on the first insulating layer and overlapping the film for stopping etching; and
an ohmic contact layer formed between the semiconductor film and either the source electrode or the drain electrode;
wherein the first contact hole extends from the second insulating layer to the first insulating layer, exposing the semiconductor film and the ohmic contact layer.

2. The array substrate according to claim 1, wherein the transparent conductive film comprises:
a thin-film contact region contacting the film for stopping etching in the first contact hole;
an electrode contact region contacting the source electrode or the drain electrode in the first contact hole;
a forming region arranged on the second insulating layer;
a first conductive region electrically connecting the thin-film contact region and the electrode contact region; and
a second conductive region electrically connecting the thin-film contact region and the forming region, without contacting the source electrode or the drain electrode.

3. The array substrate according to claim 2, wherein the transparent conductive film further comprises a pixel electrode connected to the source electrode or the drain electrode by the thin-film contact region and the forming region.

4. An array substrate for use in a display, comprising:
a first conductive film pattern pattern-formed on a transparent substrate;
a first insulating layer formed on the first conductive film pattern;
a second conductive film pattern pattern-formed above the first insulating layer, overlapping the first conductive film pattern;
a second insulating layer formed above the first insulating layer and the second conductive film pattern;
at least one contact hole extending from the first insulating layer to the second insulating layer; and
a transparent conductive film electrically connecting the first conductive film pattern and the second conductive film pattern in the at least one contact hole;
wherein the at least one contact hole is formed in a region where an edge of the second conductive film pattern overlaps the first conductive film pattern;
wherein:
the array substrate is a transistor array substrate including an inverse stagger-type transistor;
the first conductive film pattern includes a gate electrode of the inverse stagger-type transistor and a film for stopping etching;
the second conductive film pattern includes a source electrode or drain electrode of the inverse stagger-type transistor, and the source electrode or the drain electrode is formed overlapping the film for stopping etching; and
the at least one contact hole includes a first contact hole made in a region where an edge of the source electrode or the drain electrode overlaps the film for stopping etching; and
wherein the first conductive film pattern includes a gate electrode line connected to the gate electrode, the second conductive film pattern includes a jumper line overlapping the gate electrode line, and the at least one contact hole includes a second contact hole made in a region where an edge of the jumper line overlaps the gate electrode line.

5. The array substrate according to claim 4, wherein the transparent conductive film comprises:
a gate-electrode line contact region contacting the gate electrode line in the second contact hole;
a jumper-line contact region contacting the jumper line in the second contact hole;
a forming region arranged on the second insulating layer;
a first conductive region electrically connecting the gate-electrode line contact region and the jumper-line contact region; and
a second conductive region electrically connecting the gate-electrode contact region and the forming region, without contacting the jumper line.

6. The array substrate according to claim 4, wherein the jumper line has a part which overlaps the gate electrode line, and which has a convex shape and extends in a same direction as the jumper line.

7. A method of manufacturing an array substrate for use in a display, the method comprising:
pattern-forming a first conductive film pattern on a transparent substrate;
forming a first insulating layer on the first conductive film pattern;
pattern-forming a second conductive film pattern above the first insulating layer, overlapping the first conductive film pattern;
forming a second insulating layer, overlapping the first insulating layer and the second conductive film pattern;
forming at least one contact hole extending through the first insulating layer and the second insulating layer, in a region where an edge of the second conductive film pattern overlaps the first conductive film pattern; and
forming a transparent conductive film electrically connecting the first conductive film pattern and second conductive film pattern in the at least one contact hole;

wherein the array substrate is a transistor array substrate including an inverse stagger-type transistor;

wherein:
the first conductive film pattern includes a gate electrode of the inverse stagger-type transistor and a film for stopping etching;
the second conductive film pattern includes a source electrode or drain electrode of the inverse stagger-type transistor, the source electrode or the drain electrode overlapping the film for stopping etching; and
the at least one contact hole includes a first contact hole made in a region where an edge of the source electrode or the drain electrode overlaps the film for stopping etching; and wherein the first conductive film pattern comprises a gate electrode line connected to the gate electrode, the second conductive film pattern comprises a jumper line overlapping the gate electrode line, and the at least one contact hole includes a second contact hole in a region where an edge of the jumper line overlaps the gate electrode line.

8. The method according to claim 7, wherein the transparent conductive film includes:
a thin-film contact region contacting the film for stopping etching in the first contact hole;
an electrode contact region contacting the source electrode or the drain electrode in the first contact hole;
a forming region arranged on the second insulating layer;
a first conductive region electrically connecting the thin-film contact region and the electrode contact region; and
a second conductive region electrically connecting the thin-film contact region and the forming region, without contacting the source electrode or the drain electrode.

9. The method according to claim 8, wherein the transparent conductive film further comprises a pixel electrode connected to the source electrode or the drain electrode by the thin-film contact region and the forming region.

10. The method according to claim 7, wherein the transparent conductive film includes:
a transparent conductive film including a gate-electrode line contact region contacting the gate electrode line in the second contact hole;
a jumper-line contact region contacting the jumper line in the second contact hole;
a forming region arranged on the second simulating layer;
a first conductive region electrically connecting the gate-electrode line contact region and the jumper-line contact region; and
a second conductive region electrically connecting the gate-electrode contact region and the forming region, without contacting the jumper line.

11. An array substrate for use in a display, comprising:
a first conductive film pattern pattern-formed on a transparent substrate;
a first insulating layer formed on the first conductive film pattern;
a second conductive film pattern pattern-formed above the first insulating layer, overlapping the first conductive film pattern;
a second insulating layer formed above the first insulating layer and the second conductive film pattern; and
a transparent conductive film;

at least one contact hole extending from the first insulating layer to the second insulating layer, and exposing the first conductive film pattern and a region of the second conductive film pattern, which overlaps the first conductive film pattern;

wherein the transparent conductive film includes a first conductive film contact region contacting the first conductive film pattern in the at least one contact hole, a second conductive film contact region contacting the second conductive film pattern in the at least one contact hole, a forming region provided on the second insulating layer, a first conductive region electrically connecting the first conductive film contact region and the second conductive film contact region, and a second conductive region electrically connecting the first conductive film contact region and the forming region, without contacting the second conductive film pattern;

wherein:
the array substrate is a transistor array substrate including an inverse stagger-type transistor;
the first conductive film pattern includes a gate electrode of the inverse stagger-type transistor and a film for stopping etching;
the second conductive film pattern includes a source electrode or drain electrode of the inverse stagger-type transistor;
the source electrode or the drain electrode includes a part overlapping the film for stopping etching;
the at least one contact hole includes a first contact hole made from the second insulating layer to the first insulating layer, exposing the film for stopping etching and a region of the source electrode or the drain electrode, which overlaps the film for stopping etching;
the first conductive-film contact region includes a thin-film contact region contacting the film for stopping etching in the first contact hole;
the second conductive-film contact region includes a thin-film contact region contacting the film for stopping etching in the first contact hole;
the second conductive region electrically connects the thin-film contact region and the forming region, without contacting the source electrode;
the first conductive film pattern includes a gate electrode line connected to the gate electrode;
the second conductive film pattern includes a jumper line overlapping the gate electrode line;
the at least one contact hole includes a second contact hole made from the second insulating layer to the first insulating layer, exposing the gate electrode line and a region of the jumper line, which overlaps the gate electrode line;
the first conductive-film contact region includes a gate electrode line contact region contacting the gate electrode line in the second contact hole;
the second conductive-film contact region includes a jumper line contact region contacting the jumper line in the second contact hole; and
the second conductive region of the transparent conductive film electrically connects the gate-electrode line contact region and the forming region, without contacting the jumper line.

* * * * *